(12) United States Patent
Skierszkan

(10) Patent No.: US 6,570,454 B2
(45) Date of Patent: May 27, 2003

(54) MULTIPLE INPUT PHASE LOCK LOOP WITH HITLESS REFERENCE SWITCHING

(75) Inventor: Simon Skierszkan, Kanata (CA)

(73) Assignee: Zarliak Semiconductor Inc., Kanata (CA)

( * ) Notice: Subject to any disclaimer, the term of this patent is extended or adjusted under 35 U.S.C. 154(b) by 31 days.

(21) Appl. No.: 10/004,801

(22) Filed: Dec. 7, 2001

(65) Prior Publication Data

US 2002/0070811 A1 Jun. 13, 2002

(30) Foreign Application Priority Data

Dec. 9, 2000 (GB) .............................. 0030101

(51) Int. Cl.[7] .............................. H03L 7/06; H03L 7/07; H03L 7/085; H03L 7/093; H03L 7/099
(52) U.S. Cl. .............................. 331/2; 331/17; 331/18; 331/25; 327/147; 327/149; 327/156; 327/158
(58) Field of Search .............................. 331/1 A, 2, 16, 331/17, 18, 25; 327/140–150, 156–159; 332/127; 360/51; 375/376; 455/260

(56) References Cited

U.S. PATENT DOCUMENTS 5,602,884 A 2/1997 Wieczorkiewicz et al. .. 375/376
6,480,047 B2 * 11/2002 Abdel-Maguid et al. .... 327/161

* cited by examiner

Primary Examiner—David C. Mis
(74) Attorney, Agent, or Firm—Marks & Clerk

(57) ABSTRACT

A clock recovery circuit for recovering clock signals from one of a plurality of input reference signals, includes an acquisition phase locked loop (PLL) for each input. The acquisition PLL having phase comparator for comparing the phase of an input signal to a feedback signal, and first and second digital controlled oscillators (DCOs) receiving an input from the phase comparator. The first DCO of the acquisition PLL is in a feedback loop to supply an input to the phase comparator and the second DCO of the acquisition PLL has a control input to introduce a phase offset therein relative to said the DCO of the acquisition PLL and provides an output for the acquisition PLL. An output PLL has a phase comparator selectively connectable to the output of each of the acquisition PLLs. The output PLL has a first DCO providing an output for the circuit and a second DCO in a feedback loop providing a feedback signal to the phase comparator of the output PLL. The second DCO of the output PLL has a control input to introduce a phase offset therein relative to the first DCO of the output PLL. A control unit for sets the phase of the second DCO of the acquisition circuit and the second DCO of the output PLL to a common value during changeover from one input to another to avoid an instantaneous phase error upon switching reference signals.

23 Claims, 5 Drawing Sheets

MULTIPLE INPUT PHASE LOCK LOOP WITH HITLESS REFERENCE SWITCHING

BACKGROUND OF THE INVENTION

1. Field of the Invention

This invention relates in general to digital timing circuits, and more particularly to a digital phase locked loop capable of recovering a clock signal from a choice of inputs signals subject to jitter.

2. Description of Related Art

In digital networking applications, there is a requirement to provide timing reference for the SONET (synchronous optical network) OC-N and STS-N interface circuits, and TI or El primary rate digital transmission links. These timing signals must meet relevant standards such as BELLCORE GR-1244-CORE and GR-253-CORE recommendations for STRATUM 3E, 3 and 4E clocks and SONET Minimum Clock (SMC). These specifications impose stringent requirements on the transfer characteristics between the input references and the generated output clocks, and in particular they specify limitations on phase perturbations that may be generated on output clocks as a result of switching between input references.

The method of providing such timing signals is to use a phase locked loop. Typically, this consists of a phase detector comparing the input reference signal with the output of the loop divided by a suitable factor, a loop filter to eliminate high frequency fluctuations, and a controlled oscillator whose frequency is controlled in such a way as to eliminate the phase difference detected by the phase detector.

U.S. Pat. No. 5,602,884 discloses a phased locked loop using a combination of a DCO clocked by a 20 MHz clock and a tapped delay line. Since the DCO directly controls the tapped delay line, jitter free precision can be maintained to a fraction of a clock cycle. The fraction is limited by the delay time of each tap of the tapped delay line.

The conventional approach to minimizing phase perturbations on the output clocks as described in this patent is as follows: Rather than connecting the phase comparator directly to the active input reference a intermediate circuit is connected between the input reference and the phase comparator. This intermediate circuit contains an up/down counter clocked by a relatively high speed clock synchronous with the generated output clocks. The output of this counter produces a virtual reference which subsequently goes to the phase comparator. Upon activation of a reference rearrangement the following sequence of events occurs. The PLL is placed in holdover mode. The phase difference between the output clock and the assigned reference clock is calibrated by counting high speed clock cycles. This value is subsequently subtracted from the counter in producing the virtual output reference clock. The PLL is subsequently taken out of holdover and aligns to the newly conditioned virtual reference. In this manner phase offsets between the reference clocks can be built out.

The fundamental disadvantage of this approach is that the resolution of the phase build out is proportional to the frequency applied to the counter. The circuit may still generate a phase excursion on the output clocks up to a size equal to the period of the high speed clock. The maximum size of the phase excursion can only be reduced by increasing the speed of the high speed clock, the size of the phase build out counter and therefore the number of gates required and power consumption of the circuit.

An object of the invention is to provide a phase locked loop with a reference switching mechanism that alleviates the aforementioned problems with prior art.

SUMMARY OF THE INVENTION

Accordingly the present invention provides a clock recovery circuit for recovering clock signals from one of a plurality of input reference signals, comprising an acquisition phase locked loop (PLL) for each input, each said acquisition PLL having phase comparator for comparing the phase of an input signal to a feedback signal, and first and second digital controlled oscillators (DCOs) receiving an input from said phase comparator, said first DCO of said acquisition PLL being in a feedback loop to supply an input to said phase comparator and said second DCO of said acquisition PLL having a control input to introduce a phase offset therein relative to said first DCO of said acquisition PLL and providing an output for said acquisition PLL; an output PLL having a phase comparator selectively connectable to the output of each of said acquisition PLLs, said output PLL having a first DCO providing an output for said circuit and a second DCO in a feedback loop providing a feedback signal to said phase comparator of said output PLL, said second DCO of said output PLL having a control input to introduce a phase offset therein relative to said first DCO of said output PLL; and a control unit for setting the phase of the second DCO of said acquisition circuit and the second DCO of said output PLL to a common value during changeover from one input to another to avoid an instantaneous phase error upon switching reference signals.

The DCOs are preferably adding rate multipliers, one of which generates an output signal upon attainment of an overflow condition and a remainder generating a time error signal, and the other of which has a settable phase.

The feedback loop preferably includes a tapped delay line to reduce jitter.

Since each PLL has two DCOs, only one of which is in the feedback loop, during changeover of input signals it is possible to eliminate the phase error between the settable DCOs and thus prevent phase jumps occurring upon change of input.

The invention also provides a method of recovering a clock signal from one of a plurality of input reference signals comprising the steps of providing an acquisition phase locked loop (PLL) for each input, each said acquisition PLL including first and second digital controlled oscillators (DCOs); tracking a reference input signal with said first and second DCOs, said first DCO being in a feedback loop of said acquisition PLL and said second DCO providing an output of said acquisition phase locked loop; providing an output PLL selectively connectable to said acquisition PLLs, said output PLL including first and second DCOs; tracking said output of said acquisition PLLs with said first and second DCOs of said output PLL, said first DCO of said output PLL providing a recovered clock signal and said second DCO of said output PLL being in a feedback loop of said output PLL; and setting the phase of said second DCO of said acquisition PLL and said output PLL to a common value during changeover to another reference input.

BRIEF DESCRIPTION OF THE DRAWINGS

The invention will now be described in more detail, by way of example only, with reference to the accompanying drawings, in which.

DETAILED DESCRIPTION OF THE DETAILED EMBODIMENT

Figure 1:
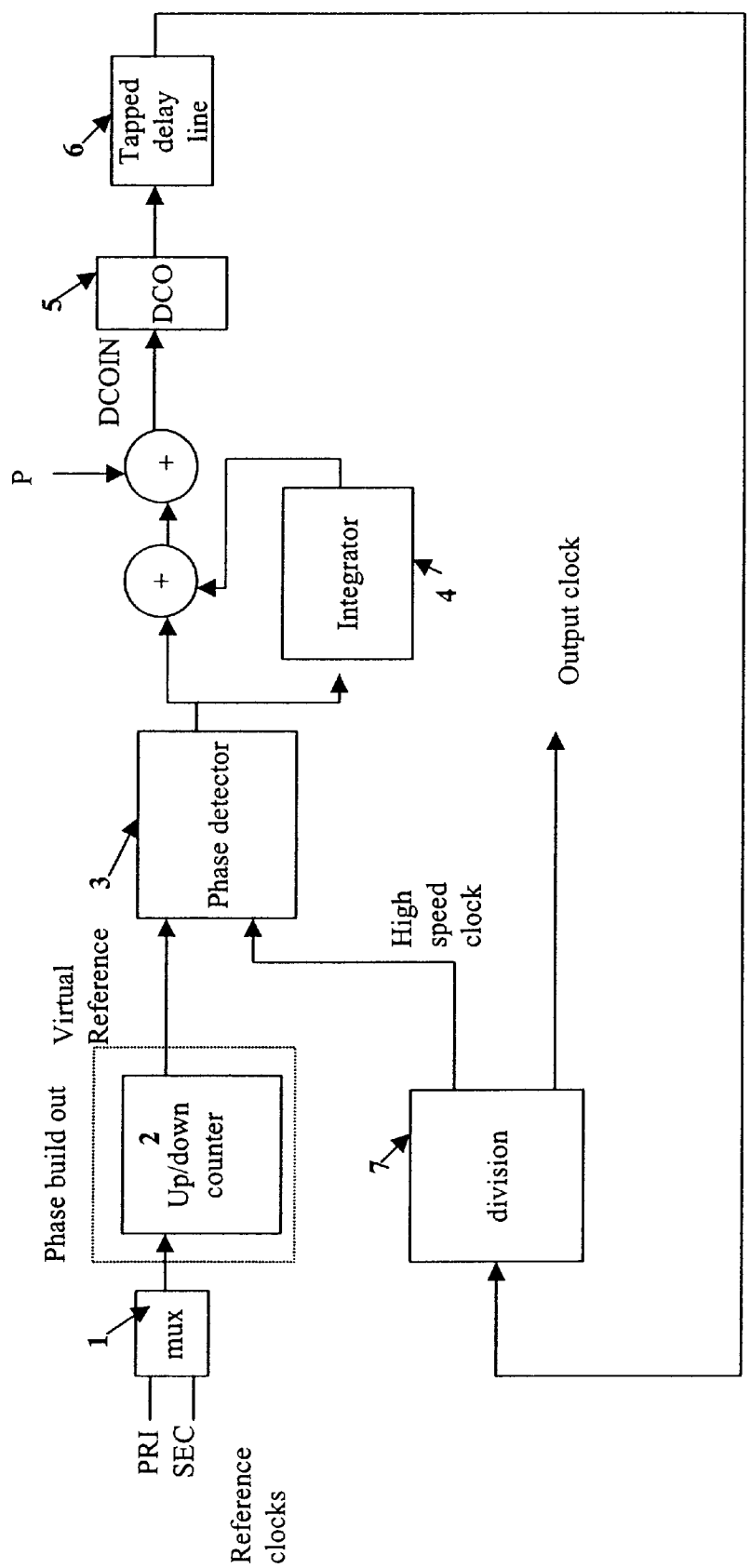
FIG. 1 is a block diagram of a prior art phase locked loop.

The prior art phase locked loop shown in FIG. 1 comprises a mux 1 selecting between two possible input reference clocks "pri" and "sec", a counter 2 that calibrates and builds out the phase difference between the two clocks upon reference switching, a phase detector 3 receiving a reference signal in, an integrator 4, a digital controlled oscillator 5 for generating an output signal at a desired frequency and a control signal representing the time error in the output signal, a tapped delay line 6 for receiving the output signal of the digital controlled oscillator 5, the tapped delay line 6 producing an output signal from a tap determined by said control signal, and a divider circuit 7 generating a feed back signal for the second input of the phase detector 3 and a synchronous high speed clock to the phase build out counter 2. The function of the integrator 4 is to eliminate input to output phase variations that would otherwise occur due to differences in the reference clock center frequency and the controlled oscillator freerun frequency. The phase detector 3 ensures that the digital controlled oscillator 5 generates an output in synchronism with the input signal in.

Figure 2:
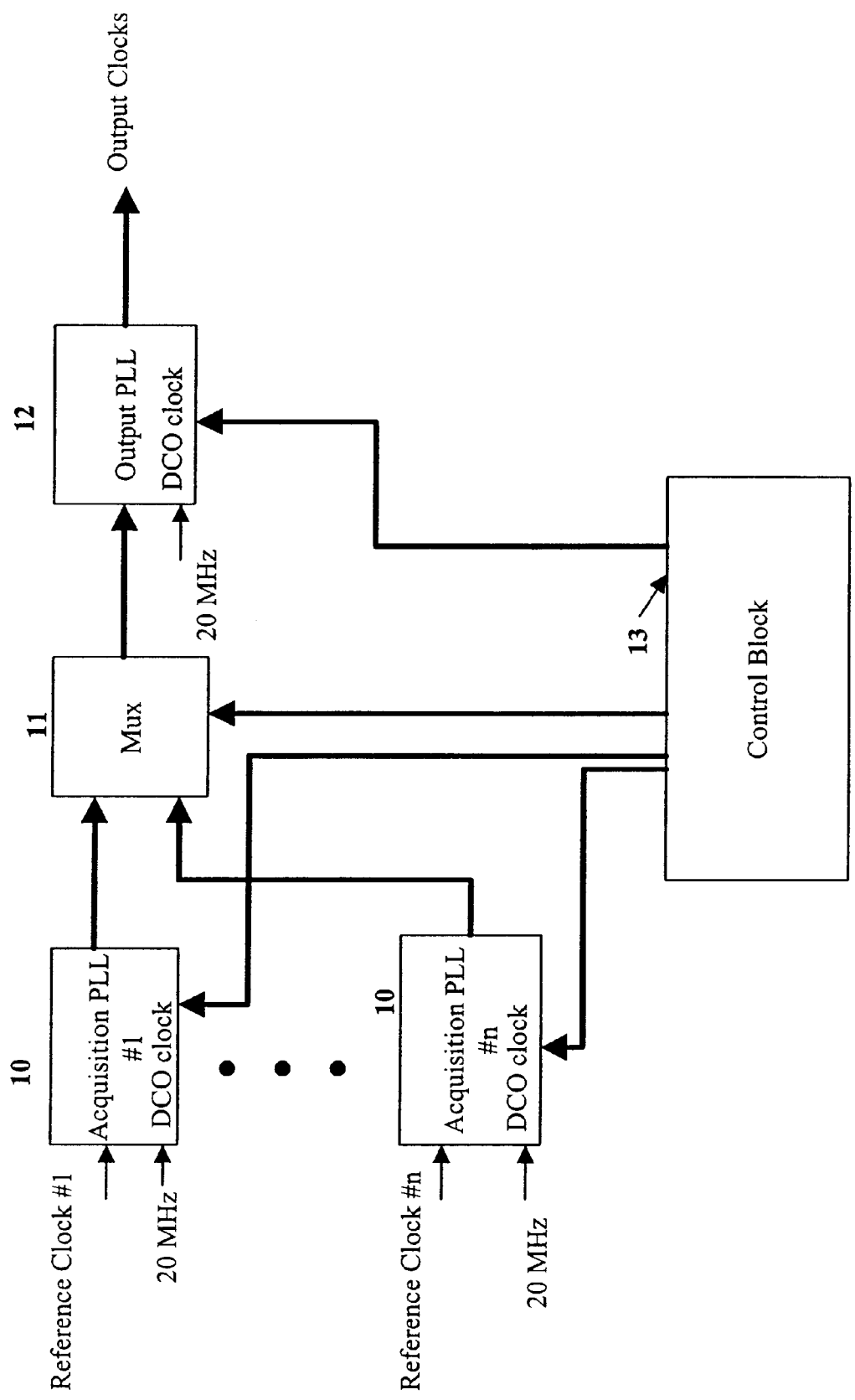
FIG. 2 is a block diagram of the overall architecture of a phase locked loop in accordance with one embodiment of the invention.

Such a prior art phase locked loop has limited means for building out the phase difference between the input reference clocks. The minimum phase perturbation that the circuit can guarantee is the period of the high speed clock applied to the phase build out counter. Referring now to FIG. 2, the phase locked loop in accordance with the principles of the invention comprises a plurality of acquisition digital phase locked loops 10 attached to each of the input references, a mux 11 with an output of a digitized clock with phase information and control information from the selected acquisition phase locked loop 10, an output phase locked loop 12 that locks to the signal coming from the mux 11. The output phase locked loop 12 generates stable clocks as the output of the circuit. A control block 13, typically a microcontroller, controls the operation of the device.

A 20 MHz input clock is used as the master clock that drives all the digital controlled oscillators (DCOs) in the acquisition PLLs 10 as well as the output PLL 12. The generated output clocks have their jitter reduced by means of a tapped delay line using the phase remainder term in the DCO as described in our co-pending application no. GB 0013059.1 filed May 31, 2000, entitled Reduced Jitter Phase Locked Loop using a Technique Multi-stage Digital Delay Line.

Figure 3:
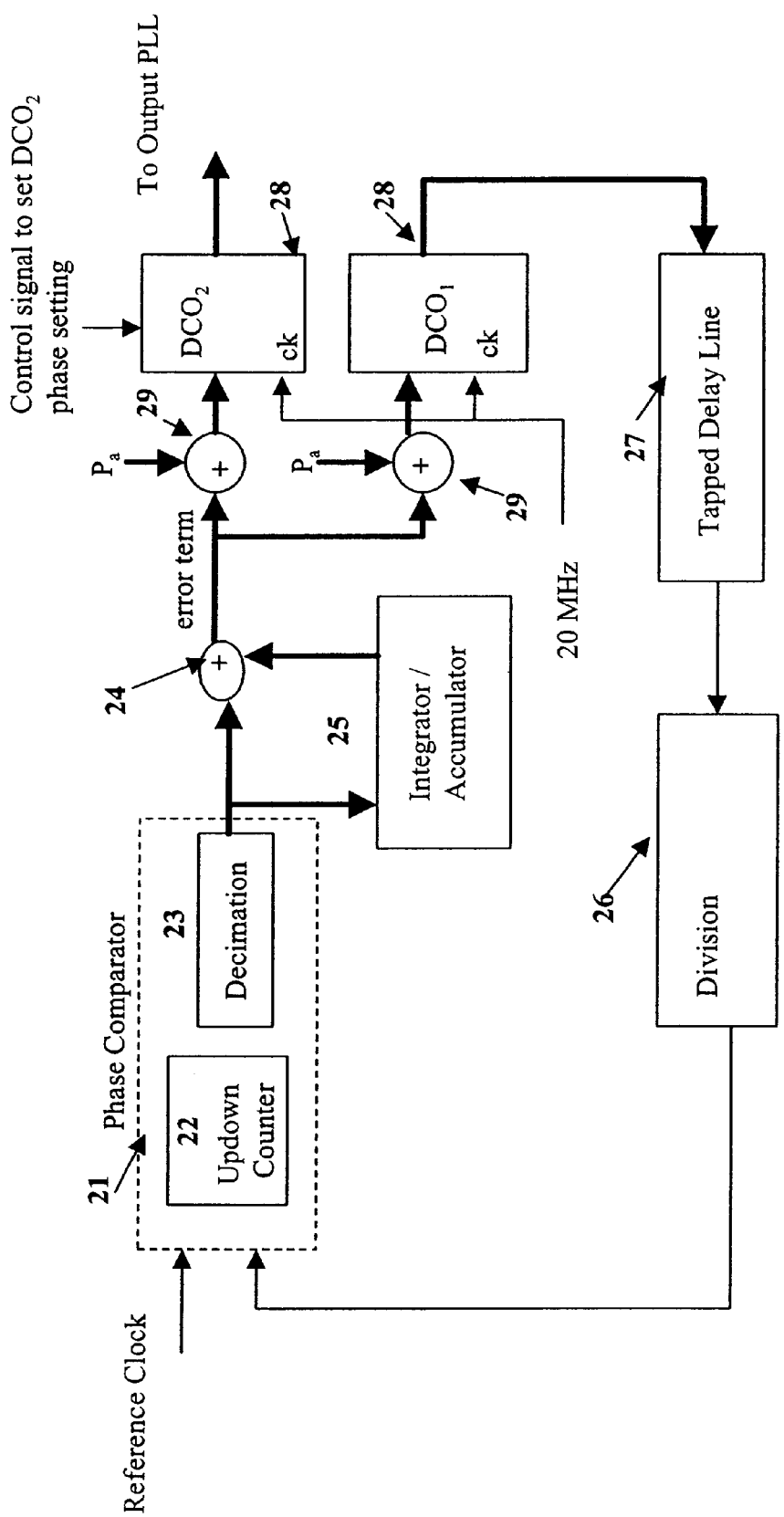
FIG. 3 is a block diagram of an acquisition phase locked loop.
Figure 5:
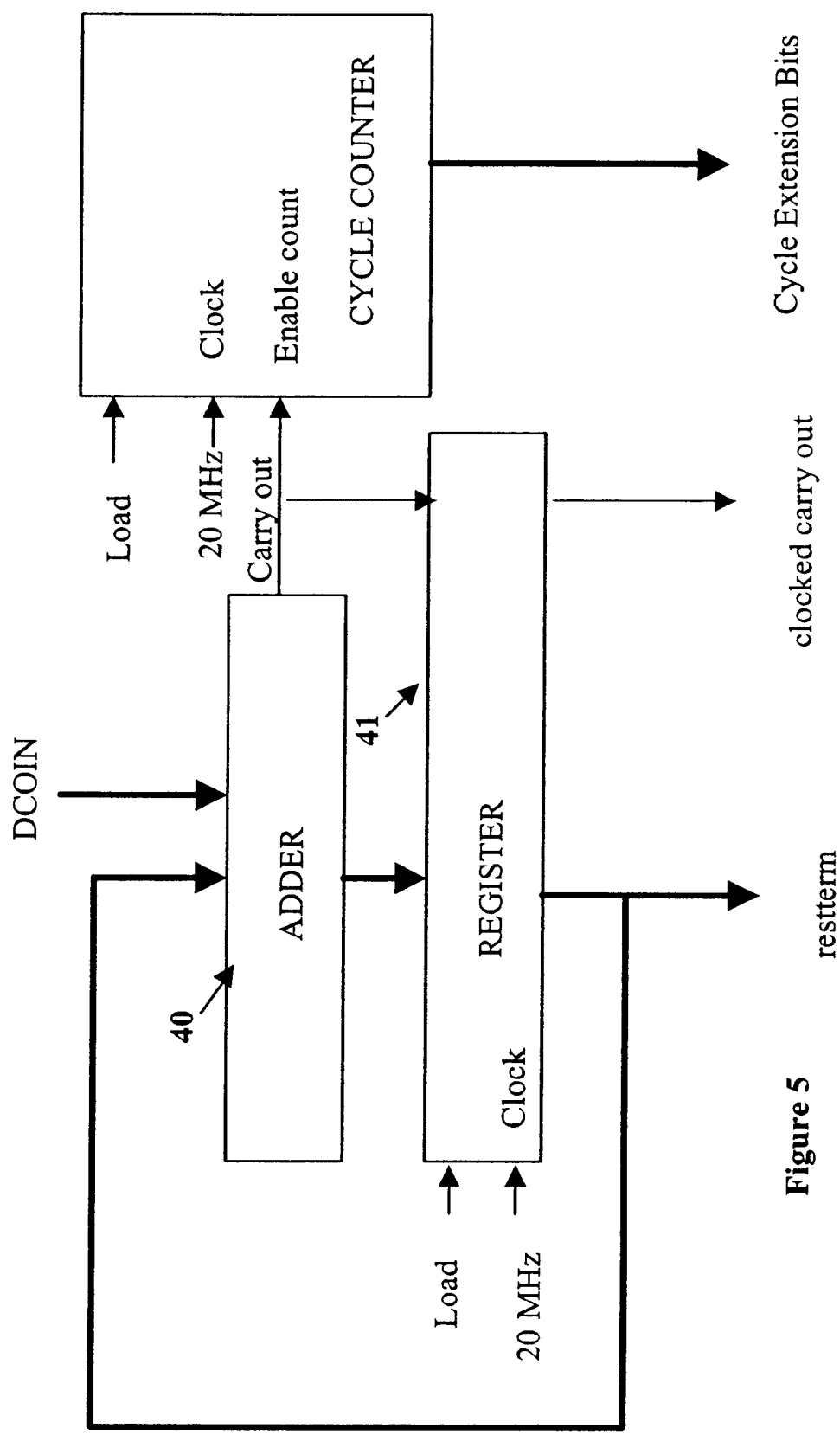
FIG. 5 is a more detailed view of a digital controlled oscillator employed in the inventive circuit.

FIG. 3 shows the acquisition PLL 10 in more detail. The phase comparator 21 is an up/down counter 22 that counts cycle slips between the reference clock and the acquisition PLL output clock. A more precise calculation of the phase offset is made by integrating and decimating the output of the cycle slip counter with decimator 23. The output of the phase comparator is integrated with an accumulator 25. The output of the phase comparator 21 is added to the output of the accumulator 25 in adder 24. The output of adder 24 is then added to a constant Pa in a pair of adders 29 connected to the respective DCOs 28. The output of the adders 29 serves as control information that speeds up or slows down (in the case of a negative number) the generated output clocks. As shown in FIG. 5, each DCO 28 comprises an adding rate multiplier that generates the desired output frequency. In this case a nominal 16.384 MHz clock is synthesized. An input word (DCO IN) is fed to adder 40 and accumulated in register 41. Each DCO 28 is clocked by the master 20 MHz signal from an external pin. As the input word DCOIN is repeatedly added to the initial value of the adder 40, the adder periodically overflows and the resulting carry signals constitute the output signal of the DCO. If there is a remainder term at the time of overflow, this appears in register 41 and represents the phase error of the DCO carry output. This remainder term (restterm) is used to control the multi-stage tapped delay lines to generate a low jitter output clock. The DCO is also extended above the carry output. The carry out enables a counter that counts up by one with each carry out. These extra bits effectively count cycles of the generated nominal 16.384 MHz output clock. These extra terms are used in the synthesis of related clocks such as the generated 12.352 MHz output clock.

The virtual frequency of the carry out of the master frequency of the DCO is the masterclock x P/Q, where P is the constant added in adders 29, and Q is the capacity of the DCO register 41. In the example, the master clock is 20 MHz.

One DCO 28-$DCO_1$, is used to synthesize an output clock that feeds back to the phase comparator 21 through tapped delay line 27 and divider 26. The system permanently seeks to align this DCO's virtual output clock to the phase to the input clock.

The second DCO 28-$DCO_2$ is identical to the first DCO with the exception that its accumulated value—the restterm plus the carry out plus the cycle extension bits, are settable by the controller 13. As the second DCO has the same free running frequency as the first DCO as determined by the DCO capacity, the master clock frequency (20 MHz) and the added constant P, and as the second DCO adds the same error term as the first DCO, the second DCO produces a virtual 16.384 MHz clock identical in frequency and frequency shifts as the first DCO. The fact that the second DCO is settable means that the only difference between the generated 16.384 MHz clocks is that there may be a arbitrary static phase offset between the two clocks. This is important because a generated clock is required that continuously aligns its phase to the input reference clock, and a synthesized clock whose phase may be arbitrarily set.

Figure 4:
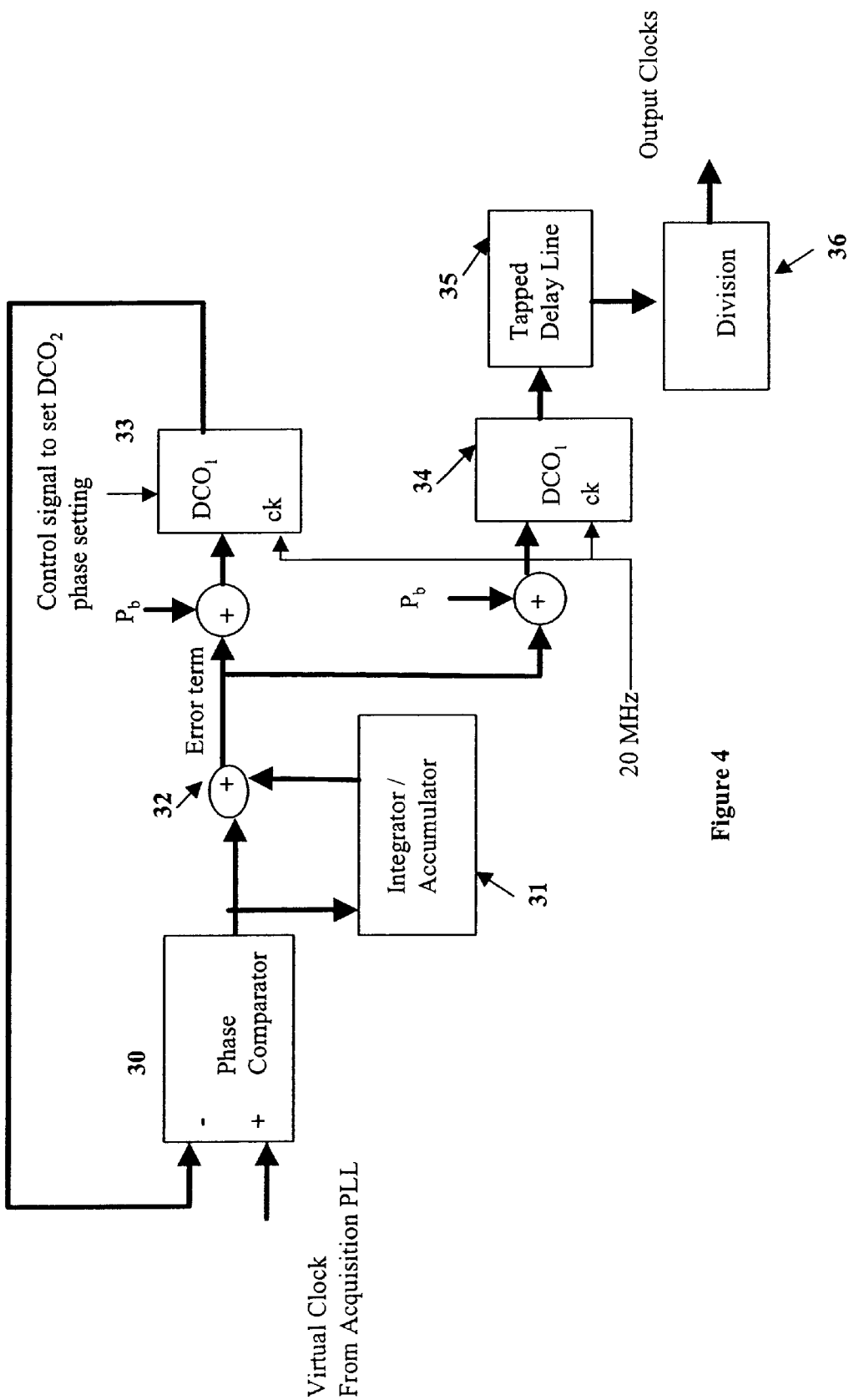
FIG. 4 is a block diagram of an output phase locked loop.

FIG. 4 shows the output PLL in greater detail. It consists primarily of a phase comparator 30, an integrator 31, a DCO-$DCO_1$, 34 that is used to generate the output clocks and a second DCO-$DC0_2$ 33 that generates a virtual 16.384 MHz clock in a digitized format clocked out by the 20 MHz master clock. As in the case of the acquisition PLL both DCOs-$DCO_1$, and $DCO_2$ have the same error information as input. $DC0_2$ is settable under control by the control unit. The phase comparator 30 is a subtractor that subtracts the restterm plus the carry out plus the cycle extension bits of $DC0_2$ 33 of the output PLL from the restterm plus the carry out plus the cycle extension bits of $DCO_2$ of the acquisition PLL. The integrator 31 is an accumulator that adds the result from the phase comparator to itself, effectively training up the center frequency of the output PLL to the acquired center frequency of the acquisition PLL.

The $DCO_1$, 34 provides an output signal to tapped delay line 35 and divider 36 to reduce jitter and provide the output for the circuit.

In normal operation all acquisition PLLs train up to their respective input reference clocks. The output PLL 12 is attached to an acquisition PLL 10. It locks to the output of the acquisition PLL and generates stable output clocks. The output PLL adjusts itself so that the values in $DCO_2$ of the output PLL will tend to match the values originating from $DCO_2$ of the acquisition $DCO_2$.

Upon reference rearrangement, (selection of a new input reference clock which equates to attaching a new acquisition PLL to the output PLL), the value in $DCO_2$ of the output PLL will subsequently tend to match the values coming from $DCO_2$ of the newly attached acquisition PLL. Since these values are uncorrelated with the values coming from $DCO_2$ of the former acquisition PLL, a simple swapping of signals between the first and second acquisition PLLs would result in an arbitrary phase offset being introduced between the output $DCO_2$ and the acquisition $DCO_2$. This offset would appear as an error term out of the phase comparator and the output PLL would adjust to that phase error introducing a phase excursion on the output clocks that equals the initial phase offset contained in the difference between the $DCO_2$ of the acquisition PLL and $DCO_2$ of the output PLL. Herein lies the value in the provision of having settable replicas of the DCOs. At the moment of reference rearrangement both $DCO_2$s-that of the acquisition PLL and that of the output PLL are set to a common value. The acquisition PLL is not perturbed because its $DCO_2$ is not in its feedback loop. The instantaneous phase error upon reference rearrangement becomes zero as $DC0_{2aq}$-$DCO_{2out}$ equals zero.

Although the invention has been described with reference to the preferred embodiment herein, this description is not to be construed in a limiting sense. Various modifications of the disclosed embodiment will become apparent to persons skilled in the art upon reference to the description of the invention. It is therefore contemplated that the appended claims will cover any such modifications or embodiments as fall within the true scope of the invention.

I claim:

1. A clock recovery circuit for recovering clock signals from one of a plurality of input reference signals, comprising:

an acquisition phase locked loop (PLL) for each input, each said acquisition PLL having phase comparator for comparing the phase of an input signal to a feedback signal, and first and second digital controlled oscillators (DCOs) receiving an input from said phase comparator, said first DCO of said acquisition PLL being in a feedback loop to supply an input to said phase comparator and said second DCO of said acquisition PLL having a control input to introduce a phase offset therein relative to said first DCO of said acquisition PLL and providing an output for said acquisition PLL;

an output PLL having a phase comparator selectively connectable to the output of each of said acquisition PLLs, said output PLL having a first DCO providing an output for said circuit and a second DCO in a feedback loop providing a feedback signal to said phase comparator of said output PLL, said second DCO of said output PLL having a control input to introduce a phase offset therein relative to said first DCO of said output PLL; and a control unit for setting the phase of the second DCO of said acquisition circuit and the second DCO of said output PLL to a common value during changeover from one input to another to avoid an instantaneous phase error upon switching reference signals.

2. A clock recovery circuit as claimed in claim 1, further comprising a tapped delay line in the feedback loop of said acquisition PLL to produce a low jitter output.

3. A clock recovery circuit as claimed in claim 1, wherein the phase comparator comprises a cycle/slip counter and a decimator for decimating the output of the cycle slip counter.

4. A clock recovery circuit as claimed in claim 1, further comprising an integrator/accumulator for integrating the output of the phase comparator.

5. A clock recovery circuit as claimed in claim 4, further comprising a first adder for adding the output of said integrator/accumulator to the output of said phase comparator.

6. A clock recovery circuit as claimed in claim 5, further comprising respective additional adders for adding constants to the output of said first adder, said additional adders being connected to the respective inputs of said first and second DCOs of said acquisition PLL.

7. A clock recovery circuit as claimed in claim 1, wherein said DCOs includes extra bits that count the cycles of the generated output clock.

8. A clock recovery circuit as claimed in claim 1, further comprising an integrator/accumulator for integrating the output of said phase comparator of said output PLL, and a first adder for adding the output of said integrator/accumulator to the output of said phase comparator of said output PLL.

9. A clock recovery circuit as claimed in claim 8, further comprising additional adders for adding a constant to the output of said first adder, said additional adders being connected to the inputs of the DCOs of said output PLL.

10. A clock recovery circuit as claimed in claim 1, wherein said digital controlled oscillators of said acquisition PLLs are adding type rate multipliers, one of which generates an output signal when attaining an overflow condition and a remainder term that generates a control signal representing the time error in each output signal.

11. A clock recovery circuit as claimed in claim 1, wherein said output of said first DCO of said output PLL is connected to a tapped delay line to reduce jitter.

12. A method of recovering a clock signal from one of a plurality of input reference signals comprising the steps of:

providing an acquisition phase locked loop (PLL) for each input, each said acquisition PLL including first and second digital controlled oscillators (DCOs);

tracking a reference input signal with said first and second DCOs, said first DCO being in a feedback loop of said acquisition PLL and said second DCO providing an output of said acquisition phase locked loop;

providing an output PLL selectively connectable to said acquisition PLLs, said output PLL including first and second DCOs;

tracking said output of said acquisition PLLs with said first and second DCOs of said output PLL, said first DCO of said output PLL providing a recovered clock signal and said second DCO of said output PLL being in a feedback loop of said output PLL; and setting the phase of said second DCO of said acquisition PLL and said output PLL to a common value during changeover to another reference input.

13. A method as claimed in claim 12, wherein the jitter in said acquisition phase locked loop is reduced with a tapped delay line.

14. A method as claimed in claim 12, wherein said DCOs have extension bits counting the output cycles of the clock generated by the DCO.

15. A method as claimed in claim 12, wherein each said PLL includes a phase comparator, and the output of the phase comparator is integrated prior to being fed to said first and second DCOs.

16. A method as claimed in claim 15, wherein cycle slips are counted with an up/down counter in said phase comparator.

17. A method as claimed in claim 16, wherein the output of the cycle slip counter is decimated.

18. A method as claimed in claim 12, wherein said acquisition PLLs are selected by a controller that also controls the phase offset of said DCOs.

19. A method as claimed in claim 18, wherein said controller controls the select input of a multiplexer to connect the active acquisition PLL to said output PLL.

20. An acquisition digital phase locked loop for recovering a stable clock signal from an input signal subject to jitter, comprising:

a digital input circuit receiving said input signal;

first and second digital controlled oscillators for generating outputs at a desired frequency and a control signal representing the time error in each said output signal; plurality of tapped delay lines, said tapped delay lines comprising a plurality of delay means, the sum of the delay of said plurality of tapped delay line being less than one clock cycle of said digital controlled oscillators; and a digital phase comparator for receiving said at least one input signal from said input circuit and said output signal from said last plurality tapped delay line providing means to generate a digital input signal controlling said digital controlled oscillators.

21. An acquisition digital phase locked loop as claimed in claim 20, wherein said digital controlled oscillators are adding type rate multipliers, one of which generates said output signal when attaining an overflow condition and a remainder term generating said control signal, and a second of said digital controlled oscillators having a settable phase.

22. An output digital phase locked for generating stable output clocks comprising:

a digital phase comparator that subtracts the virtual output clock from the acquisition PLL from the feedback virtual clock from the output PLL;

an integrator having an accumulator that adds the output of the phase comparator to itself; and first and second digital controlled oscillators for generating an output at a desired frequency and a control signal representing the time error in said output signal, the first digital controlled oscillator feeding control signals to a plurality of tapped delay lines and the second digital controlled oscillator being settable provides feedback signals to the phase comparator.

23. A method as claimed in claim 22, further comprising a plurality of tapped delay lines, said tapped delay lines comprising a plurality of delay means, the sum of the delay of said plurality tapped delay line being less than one clock cycle of said digital controlled oscillators.

* * * * *

UNITED STATES PATENT AND TRADEMARK OFFICE
CERTIFICATE OF CORRECTION

PATENT NO.    : 6,570,454 B2
DATED         : May 27, 2003
INVENTOR(S)   : Simon Skierszkan It is certified that error appears in the above-identified patent and that said Letters Patent is hereby corrected as shown below:

<u>Title page,</u>
Item [73], Assignee "Zarliak Semiconductor Inc." should read
-- ZARLINK SEMICONDUCTOR INC. --

Signed and Sealed this

Thirtieth Day of September, 2003

JAMES E. ROGAN
*Director of the United States Patent and Trademark Office*